United States Patent
Ishimori et al.

(10) Patent No.: US 9,200,766 B2
(45) Date of Patent: Dec. 1, 2015

(54) LIGHTING FIXTURE

(71) Applicant: PANASONIC CORPORATION, Osaka (JP)

(72) Inventors: Atsuyoshi Ishimori, Osaka (JP); Toshifumi Ogata, Osaka (JP); Wakaba Hyodo, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 48 days.

(21) Appl. No.: 14/141,666

(22) Filed: Dec. 27, 2013

(65) Prior Publication Data

US 2014/0185283 A1   Jul. 3, 2014

(30) Foreign Application Priority Data

Dec. 28, 2012  (JP) ................ 2012-288047

(51) Int. Cl.

| F21V 9/00 | (2015.01) |
|---|---|
| F21K 99/00 | (2010.01) |
| F21S 8/02 | (2006.01) |
| F21V 21/30 | (2006.01) |
| F21V 23/00 | (2015.01) |
| F21Y 101/02 | (2006.01) |
| F21Y 105/00 | (2006.01) |
| F21Y 113/00 | (2006.01) |

(Continued)

(52) U.S. Cl.
CPC . *F21K 9/56* (2013.01); *F21S 8/026* (2013.01); *F21V 21/30* (2013.01); *F21V 23/003* (2013.01); *F21Y 2101/02* (2013.01); *F21Y 2105/003* (2013.01); *F21Y 2113/005* (2013.01); *H01L 25/0753* (2013.01); *H01L 33/504* (2013.01); *H01L 2924/0002* (2013.01)

(58) Field of Classification Search
CPC ...... F21V 21/30; F21Y 2113/005; F21K 9/56
USPC ........................................ 362/231
See application file for complete search history.

(56) References Cited

U.S. PATENT DOCUMENTS

| 5,548,499 A * | 8/1996 | Zadeh ........................ 362/366 |
| 6,211,626 B1 * | 4/2001 | Lys et al. .................... 315/291 |
| 2003/0123252 A1 * | 7/2003 | Cercone et al. ............. 362/147 |

(Continued)

FOREIGN PATENT DOCUMENTS

| CN | 201934954 | 8/2011 |
| CN | 102192424 | 9/2011 |

(Continued)

OTHER PUBLICATIONS

Extended European Search Report in 13199666.2, dated Mar. 25, 2014.

(Continued)

*Primary Examiner* — Evan Dzierzynski
(74) *Attorney, Agent, or Firm* — Greenblum & Bernstein, P.L.C.

(57) ABSTRACT

A lighting fixture includes: a frame; a housing that is supported so as to be swingable relative to the frame about a swing axis; a first light emitting part that is provided in the housing and emits light of a first color; and a second light emitting part that is provided in the housing and emits light of a second color differing from the first color, wherein the first light emitting part and the second light emitting part are arranged in parallel to the swing axis.

6 Claims, 11 Drawing Sheets

(51) Int. Cl.
*H01L 25/075* (2006.01)
*H01L 33/50* (2010.01)

(56) References Cited

U.S. PATENT DOCUMENTS

| | | | |
|---|---|---|---|
| 2005/0111224 A1* | 5/2005 | Lin | B44C 5/005 362/276 |
| 2006/0262521 A1 | 11/2006 | Piepgras et al. | |
| 2009/0109670 A1 | 4/2009 | Boyer | |
| 2009/0290340 A1 | 11/2009 | Hayakawa | |
| 2010/0103663 A1 | 4/2010 | Kubis et al. | |
| 2011/0222264 A1 | 9/2011 | Matsuda et al. | |
| 2011/0278605 A1 | 11/2011 | Agatani et al. | |
| 2011/0285292 A1 | 11/2011 | Mollnow et al. | |
| 2012/0044670 A1 | 2/2012 | Piepgras et al. | |

FOREIGN PATENT DOCUMENTS

| | | |
|---|---|---|
| CN | 102216673 | 10/2011 |
| EP | 2365525 | 9/2011 |
| JP | 2012-004519 | 1/2012 |
| TW | 200905128 | 2/2009 |
| WO | 2009/055334 | 4/2009 |
| WO | 2010/048221 | 4/2010 |
| WO | 2012/026420 | 3/2012 |

OTHER PUBLICATIONS

Office Action issued in China Counterpart Patent Appl. No. 201310733675.2, dated Aug. 21, 2015, along with an English translation thereof.

* cited by examiner

LIGHTING FIXTURE

This application is based on application No. 2012-288047 filed in Japan, the contents of which are hereby incorporated by reference.

TECHNICAL FIELD

The present invention relates to a lighting fixture using light emitting elements such as LEDs (Light Emitting Diodes), and particularly to a universal downlight whose illumination direction can be changed.

BACKGROUND ART

There has been used a so-called universal downlight which is a ceiling-embedded lighting fixture and includes a light emitting part whose illumination direction can be freely changed by a user. Conventionally, spatial presentation by illuminating wall surfaces with use of universal downlights has been performed in various types of facilities such as restaurants, museums, and commodity exhibition halls.

Also, lighting fixtures using LEDs have recently started to become widespread as energy-saving and long-life lighting fixtures alternative to incandescent lights and fluorescent lights. For example, Patent Literature 1 discloses an LED lighting fixture having the structure in which white light sources of two colors each having a different color temperature are each integrated and arranged, and a driving current is separately supplied to the white light sources of the two colors. With this structure, the LED lighting fixture tones light output from the white light sources of the two colors to illuminate with a user's desired white light which ranges from neutral light to incandescent light.

CITATION LIST

Patent Literature

[Patent Literature] Japanese Patent Application Publication No. 2012-4519

SUMMARY OF INVENTION

Technical Problem

There has been a problem that when a universal downlight illuminates a wall with white light using white light sources of two colors as light emitting parts thereof, color unevenness is easily noticeable in a range of the wall which is near a ceiling. This is because the white light of the two colors is not sufficiently diffused in the range of the wall which is near the ceiling due to a short distance between the light emitting parts and an illuminated surface.

The present invention was made in view of the above problem, and aims to provide a lighting fixture which includes a plurality of light emitting parts which emit light of different colors and makes it difficult to notice color unevenness which occurs in the case where a wall is illuminated with light of the different colors emitted from the light emitting parts.

Solution to Problem

In order to achieve the above aim, one aspect of the present invention provides a lighting fixture comprising: a frame; a housing that is supported so as to be swingable relative to the frame about a swing axis; a first light emitting part that is provided in the housing and emits light of a first color; and a second light emitting part that is provided in the housing and emits light of a second color differing from the first color, wherein the first light emitting part and the second light emitting part are arranged in parallel to the swing axis.

Advantageous Effects of Invention

With the above structure, when the first light emitting part and the second light emitting part illuminate a wall while the housing swings relative to the frame, a range of the wall where light of two colors is not sufficiently diffused (range of the wall which is near a ceiling) is illuminated with light emitted from the first light emitting part and light emitted from the second light emitting part. Also, other remaining range of the wall is illuminated with light which has undergone mixing of the light of the two colors. Therefore, it is difficult to notice color unevenness which occurs at the boundary between the range where the light of the two colors is not sufficiently diffused and the other remaining range.

DESCRIPTION OF EMBODIMENTS

The following describes a lighting fixture which is an embodiment of the present invention, with reference to the drawings.

<Structure of Lighting Fixture>

Description is given on a structure of a lighting fixture 1 which is an embodiment of the present invention with reference to FIG. 1 to FIG. 5.

Figure 1:
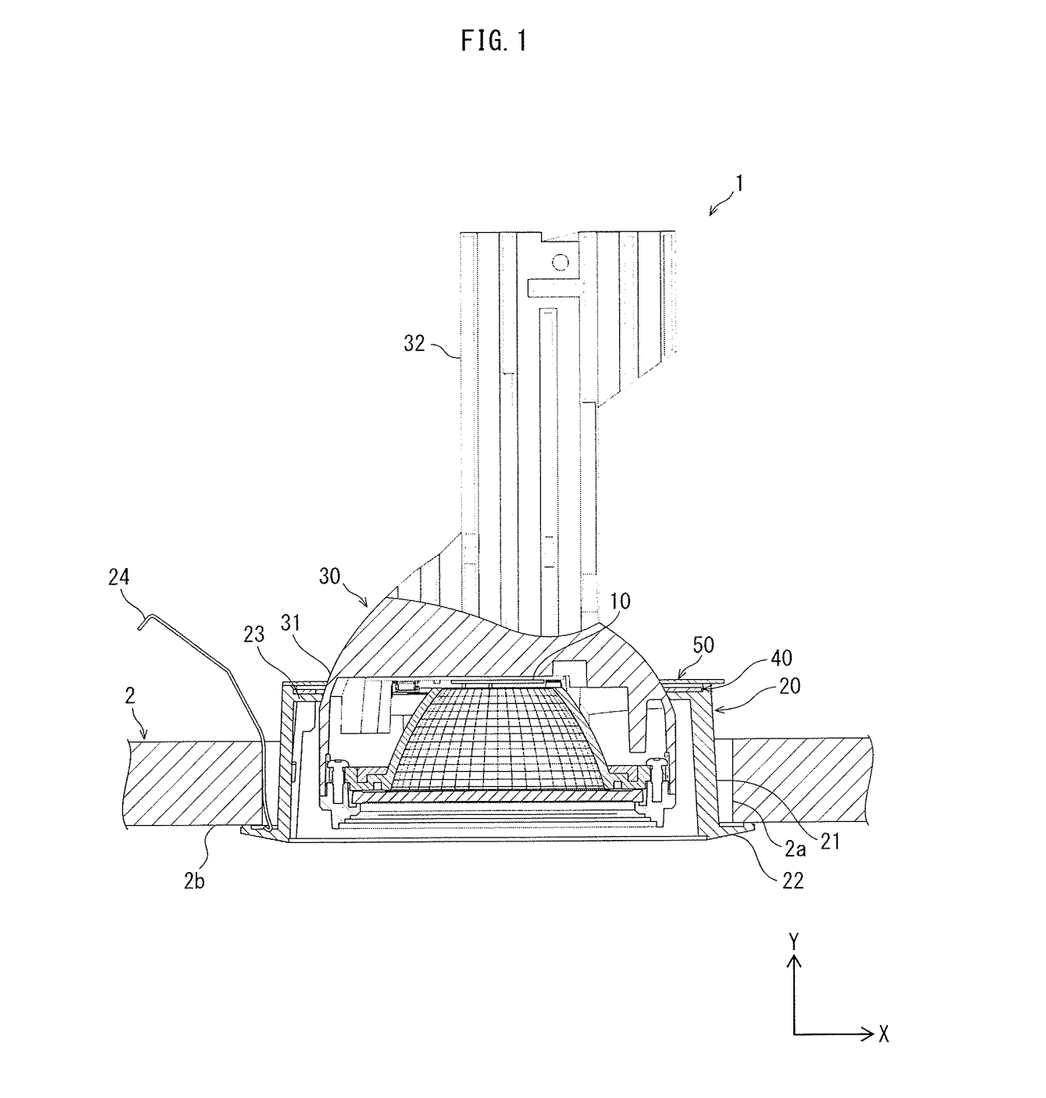
FIG. 1 is a cross-sectional view showing a lighting fixture relating to an embodiment of the present invention which is placed on a ceiling.

As shown in FIG. 1, the lighting fixture 1 includes a light emitting module 10, a frame 20, a housing 30, a bearing 40, and a hold-down member 50.

The frame 20 includes a main frame body 21 which is substantially cylindrical, a flange 22 which is substantially annular, a bearing placement part 23 which is substantially annular, and three attachment springs 24. While the flange 22 extends outward from one of openings of the main frame body 21, the bearing placement part 23 extends inward from the other opening of the main frame body 21. The frame 20 is for example a metal member.

The frame 20 is fixed to a ceiling 2. Specifically, the frame main body 21, the bearing mounting part 23, and the attachment springs 24 in an elastically deformed state are embedded into an embedding hole 2a of the ceiling 2, and then the frame main body 21 and the bearing mounting part 23 are fixed to the ceiling 2 by the attachment springs 24 in an elastically restored state while the flange 22 is in abutment with a ceiling surface 2b.

Figure 2:
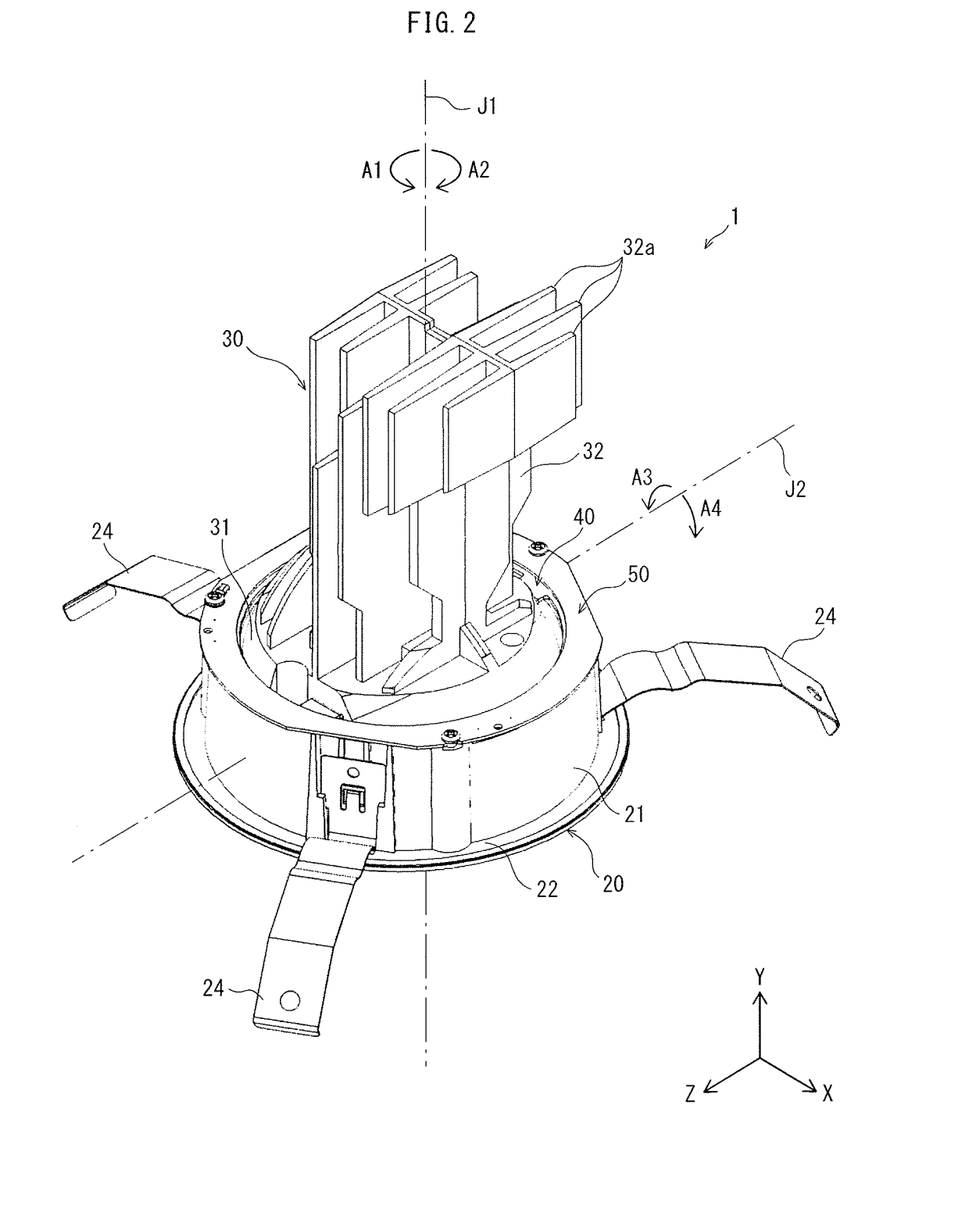
FIG. 2 is a perspective view showing the lighting fixture relating to the embodiment of the present invention.

As shown in FIG. 2, the housing 30 is a metal member including a module housing part 31 and a heat sink 32 which are integrally formed. The module housing part 31 is cylindrical and bottomed, and houses therein the light emitting module 10, a reflecting mirror 34, and a diffuser 35. The heat sink 32 extends from a bottom of the module housing part 31, and has a plurality of radiating fins 32a.

The housing 30 is rotatable relative to the frame 20 in respective directions indicated by arrows A1 and A2 about a rotational axis J1 which is parallel to the Y-axis. Also, the housing 30 is swingable in respective directions indicated by arrows A3 and A4 about a swing axis J2 which is parallel to the Z-axis. That is, the lighting fixture 1 is a so-called universal downlight, and a user can freely change the illumination direction of the lighting fixture 1 which is placed on the ceiling 2.

Figure 3:
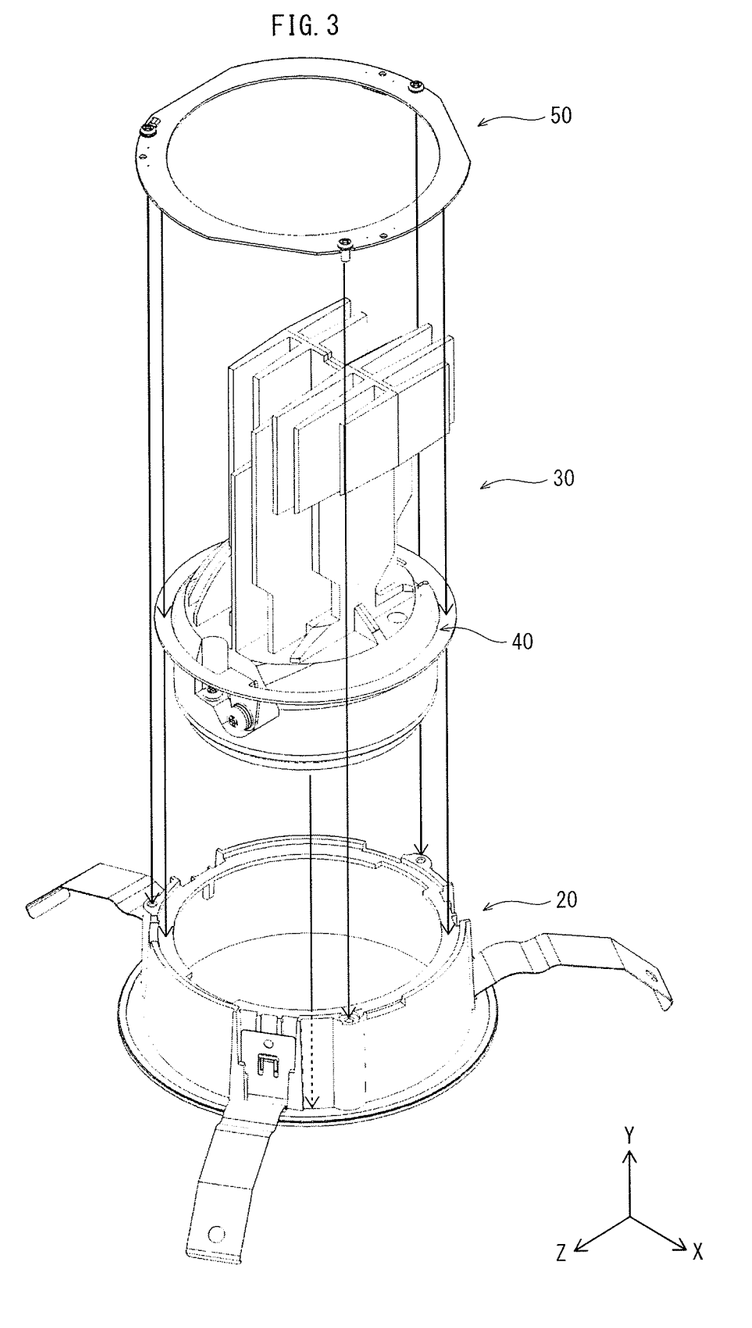
FIG. 3 is an exploded perspective view describing rotation of the lighting fixture relating to the embodiment of the present invention.

FIG. 3 describes that the housing 30, which houses therein the light emitting module 10, is attached to the frame 20 so as to be rotatable relative to the frame 20.

As shown in FIG. 3, the bearing 40 is fit onto the housing 30 so as to be provided near the boundary between the module housing part 31 and the heat sink 32. The housing 30 is attached to the frame 20 via the bearing 40. Specifically, while the module housing part 31 is housed in the frame main part 21 and the bearing 40 is mounted on the bearing mounting part 23, the bearing 40 is held down to the bearing mounting part 23 by the hold-down member 50. As a result, the housing 30 is fixed to the frame 20.

Here, the hold-down member 50 is fixed only to the bearing mounting part 23. A gap between the hold-down member 50 and the bearing mounting part 23 is slightly greater than the thickness of the bearing 40. Accordingly, the bearing 40 is rotatable about the rotational axis J1 while being prevented from moving upward and downward. The housing 30, which is fixed to the bearing 40, is rotatable 360 degrees relative to the frame 20 about the rotational axis J1, integrally with the bearing 40.

Figure 4:
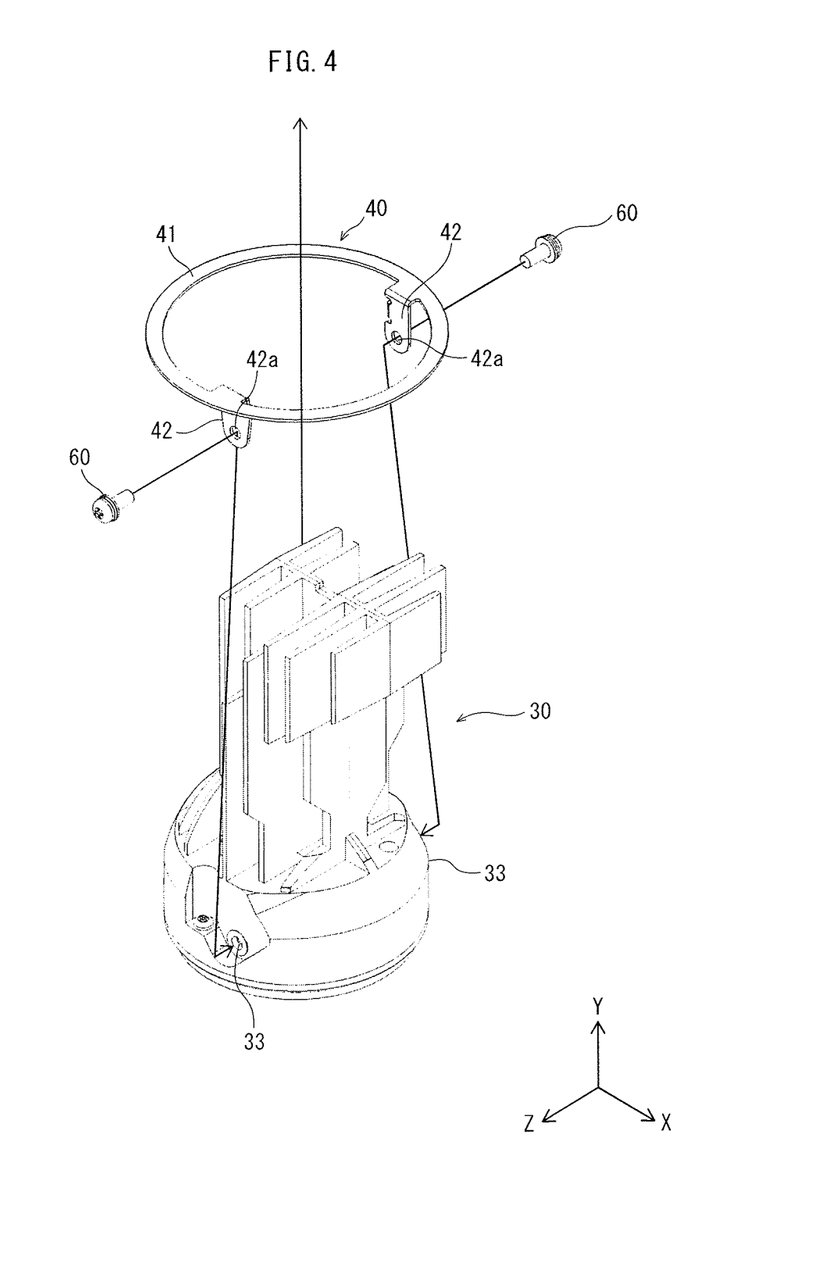
FIG. 4 is an exploded perspective view describing swing of the lighting fixture relating to the embodiment of the present invention.

FIG. 4 describes that the housing 30, which houses therein the light emitting module 10, is attached to the frame 20 so as to be swingable relative to the frame 20.

As shown in FIG. 4, the housing 30 is supported by the bearing 40 so as to be swingable about a pair of bolts 60 functioning as the swing axis J2. The bearing 40 includes a main part 41 which is annular plate-like and a pair of attachment pieces 42 which are provided on an outer edge of the main part 41 so as to face each other. The attachment pieces 42 each have an insertion hole 42a into which a corresponding one of the pair of bolts 60 functioning as the swing axis J2 is to be inserted.

On the other hand, the housing 30 has two screw holes 33 on a surface thereof onto which the bearing 40 is fit. The screw holes 33 correspond in position to the respective insertion holes 42a of the bearing 40. The housing 30 is fixed to the bearing 40 by the bolts 60, by screwing the bolts 60 which have been inserted into the respective insertion holes 42a coupled to the respective screw holes 33, further into the respective screw holes 33. As a result, the housing 30 is supported so as to be swingable relative to the bearing 40 about the pair of bolts 60 functioning as the swing axis J2. Note that the swing axis J2 is eccentric to the center of the bearing 40.

Figure 5:
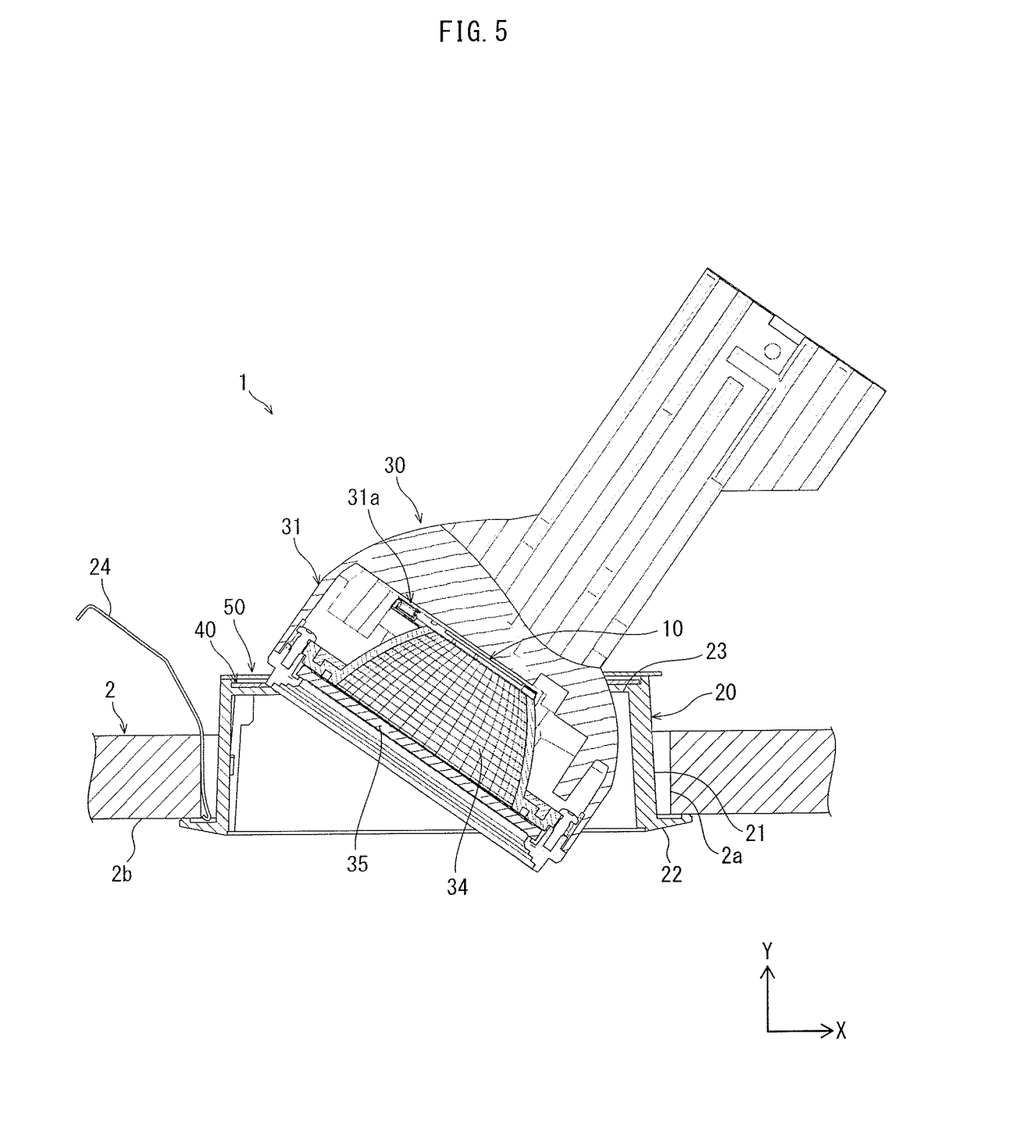
FIG. 5 is a cross-sectional view showing an example of use state of the lighting fixture relating to the embodiment of the present invention.

The lighting fixture 1, which is assembled and embedded in the ceiling 2 as described above, is usable while the housing 30 is inclined relative to the frame 20 as shown in FIG. 5.

As shown in FIG. 5, the light emitting module 10 is attached to a bottom surface 31a of the module housing part 31. The reflecting mirror 34 is substantially cylindrical, and has a diameter which increases as the distance from the light emitting module 10 increases. The reflecting mirror 34 has a light reflecting surface inside thereof. The reflecting mirror 34 is housed in the module mounting part 31 so as to surround the light emitting module 10. The diffuser 35 is placed so as to close an opening of the reflecting mirror 34 opposite to the light emitting module 10. With this structure, light emitted from the light emitting module 10 is reflected by the reflecting mirror 34 and diffused by the diffuser 35.

As shown in FIG. 5, when the housing 30 swings, an angle of inclination of the bottom surface 31a relative to the ceiling 2 varies. In accordance with this variation, an angle of inclination of the light emitting module 10 relative to the ceiling 2 also varies. This also results in variation of an angle of light emission with respect to light, which is emitted from the light emitting module 10, reflected by the reflecting mirror 34, and diffused by the diffuser 35.

The light emitting module 10 is electrically connected with a circuit unit. The light emitting module 10 receives an electrical power supplied from the circuit unit thereby to emit light. The circuit unit is described later in detail.

<Structure of Light Emitting Module>

Figure 6:
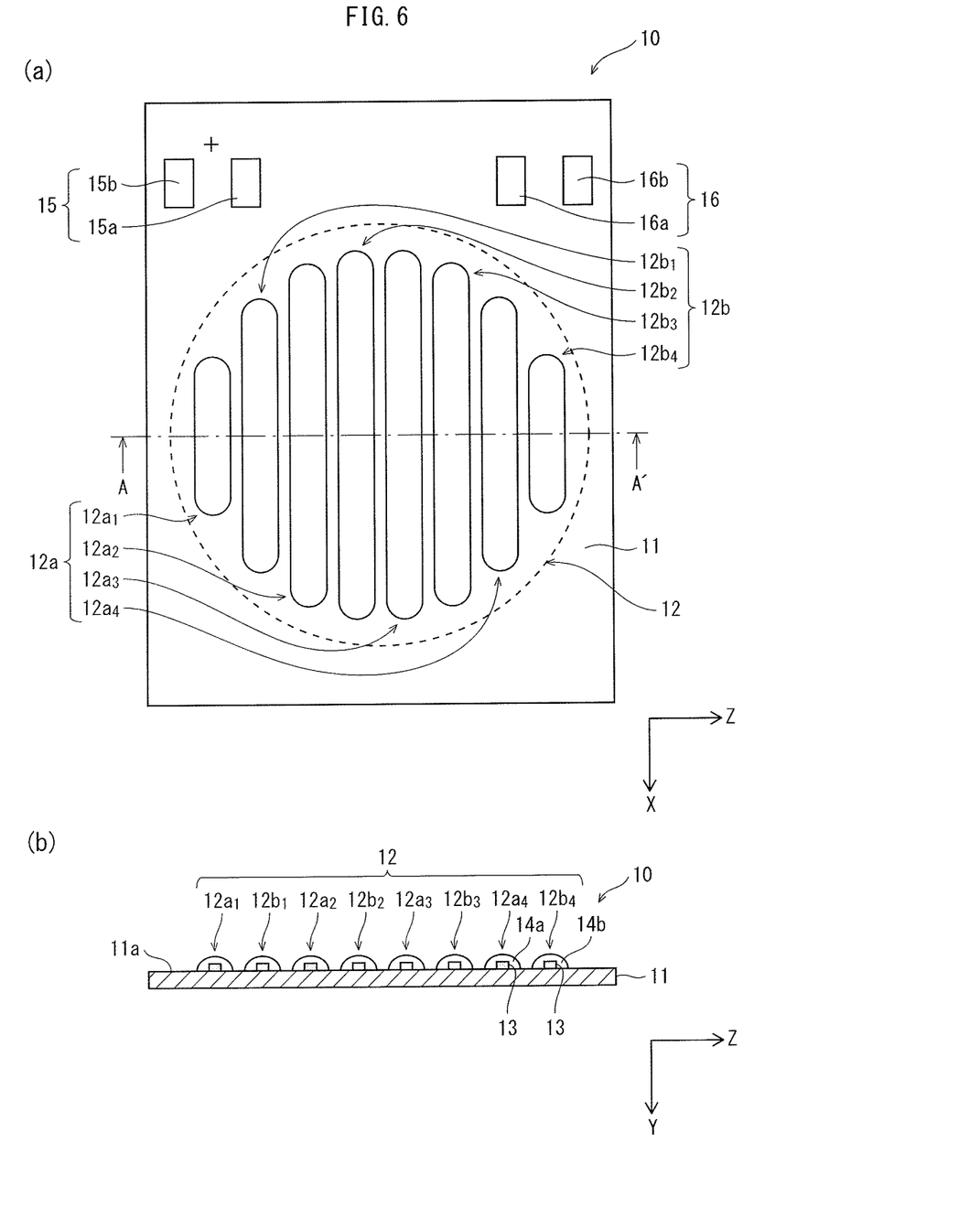
FIG. 6 shows a structure of a light emitting module.

Next, the light emitting module 10 is described in detail with reference to FIG. 6 and FIG. 7. Section (a) of FIG. 6 is a plane view showing the light emitting module 10. Section (b) of FIG. 6 is a cross-sectional view showing the light emitting module 10, taken along a line A-A' in section (a) of FIG. 6.

As shown in section (a) of FIG. 6, the light emitting module 10 includes a substrate 11, first light emitting parts $12a_1$ to $12a_4$, second light emitting parts $12b_1$ to $12b_4$, and terminals 15a, 15b, 16a, and 16b.

The substrate 11 is a rectangular plate, and has a double-layered structure of an insulating layer such as a ceramic substrate and a heat conductive resin and a metal layer such as an aluminum substrate, for example.

Figure 7:
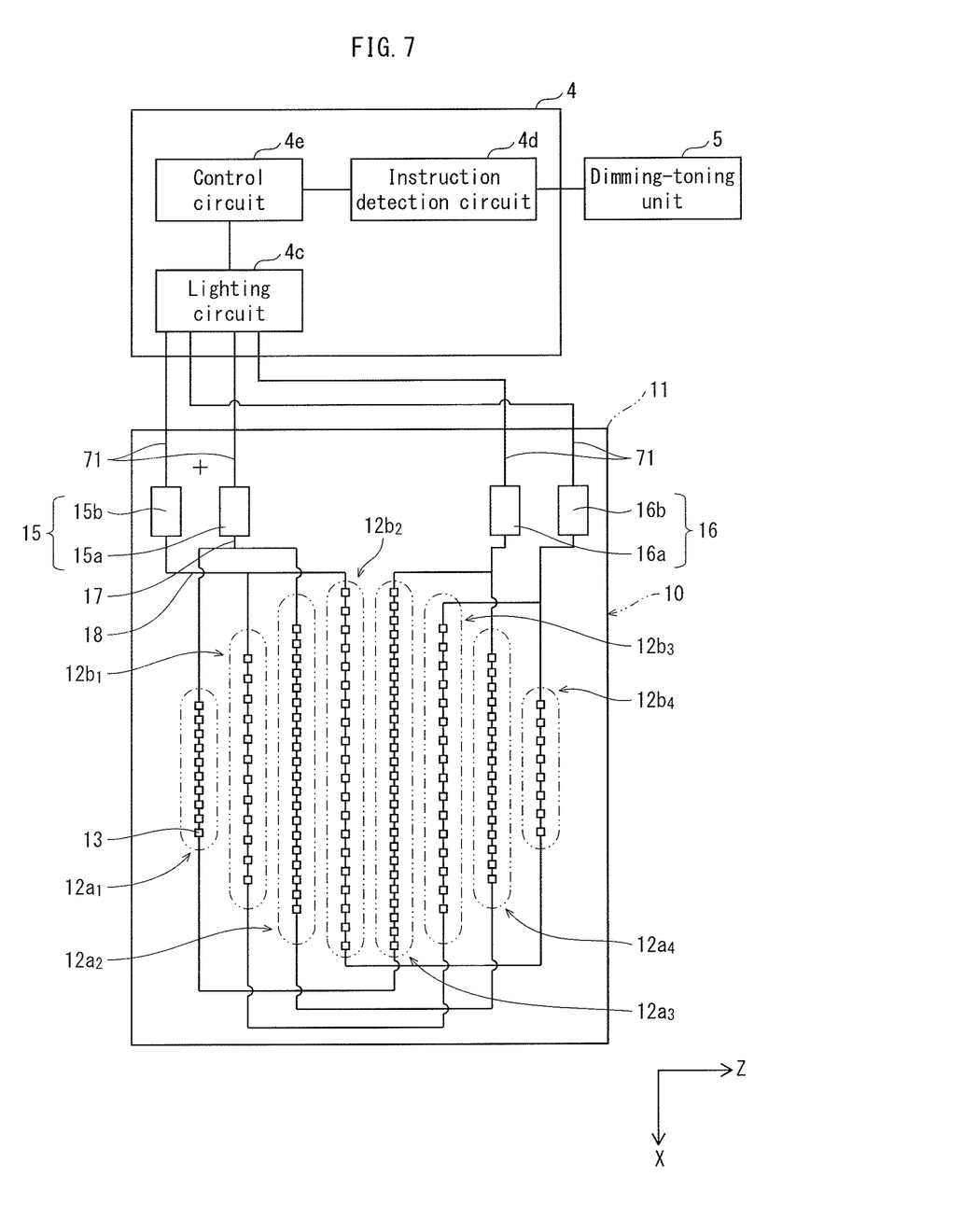
FIG. 7 describes electrical connection between light emitting elements and a circuit unit.

As shown in section (b) of FIG. 6 and FIG. 7, the first light emitting parts $12a_1$ to $12a_4$ are each composed of a plurality of light emitting elements 13 and a first phosphor layer 14a, and the second light emitting parts $12b_1$ to $12b_4$ are each composed of a plurality of light emitting elements 13 and a second phosphor layer 14b.

The light emitting elements 13 are each for example a GaN blue LED which emits blue light having a peak wavelength of 430 nm to 470 nm.

As shown in FIG. 7, a plurality of element arrays arranged in the Z-axis direction are mounted on the substrate 11. The element arrays are each composed of a plurality of light emitting elements 13 which are linearly arranged in the X-axis direction. For example, the light emitting elements 13 are face-up mounted on an upper surface 11a of the substrate 11 with use of the COB (Chip on Board) technique. The number of light emitting elements 13 included in each element array decreases from the center outward on the substrate 11 in the Z-axis direction. Accordingly, the light emitting module 10 has a light emitting surface 12 whose entire shape is substantially a circle.

An element array is sealed by one of a first phosphor layer 14a and a second phosphor layer 14b which are elongated, thereby to constitute a light emitting part. Element arrays which are each sealed by the first phosphor layer 14a are the first light emitting parts $12a_1$ to $12a_4$. Element arrays which are each sealed by the second phosphor layer 14b are the second light emitting parts $12b_1$ to $12b_4$. Accordingly, the shape of the first light emitting parts $12a_1$ to $12a_4$ and the shape of the second light emitting parts $12b_1$ to $12b_4$ depend on the shape of the first phosphor layer 14a and the shape of the second phosphor layer 14b, respectively. The first light emitting parts $12a_1$ to $12a_4$ and the second light emitting parts $12b_1$ to $12b_4$ are each elongated and each have a longitudinal direction in the X-axis direction.

The element arrays are separately sealed in this way. This provides a space between each two adjacent of the sealing members, thereby to improve the heat sink effect.

The first phosphor layer 14a is formed by dispersing a wavelength conversion material in a transparent resin material. The transparent resin material may be mixed with a dispersing material in addition to the transparent resin material. The transparent resin material may be a silicone resin, a fluoro resin, a silicone epoxy hybrid resin, a urea resin, or the like. The wavelength conversion material may be a yellow phosphor, a combination of a green phosphor and a red phosphor, or the like. Specifically, the wavelength conversion material may be one of a phosphor having a garnet structure which is known as a YAG phosphor, an oxynitride phosphor having a sialon structure, other oxynitride phosphor, a sulfide phosphor, a silicate phosphor, and the like, or a mixture of at least two types of these phosphors. Light emitted from the light emitting element 13 is wavelength-converted by the yellow phosphor, the green phosphor, and the red phosphor into yellow light, green light, and red light, respectively.

The first light emitting parts $12a_1$ to $12a_4$ each output white light having a correlated color temperature in the vicinity of 2200 K. The white light results from mixing of blue light emitted from the light emitting elements 13 and at least one of yellow light, green light, and red light which are generated due to wavelength-conversion of part of the blue light by the first phosphor layer 14a.

The second phosphor layer 14b has the same structure as the first phosphor layer 14a. The second phosphor layer 14b differs from the first phosphor layer 14a in terms of amount, type, rate, and so on of a phosphor to be added as a wavelength conversion material.

The second light emitting parts $12b_1$ to $12b_4$ each output white light having a correlated color temperature in the vicinity of 8000 K. The white light results from mixing of blue light emitted from the light emitting elements 13 and at least one of yellow light, green light, and red light which are generated due to wavelength-conversion of part of the blue light by the second phosphor layer 14b.

Figure 8:
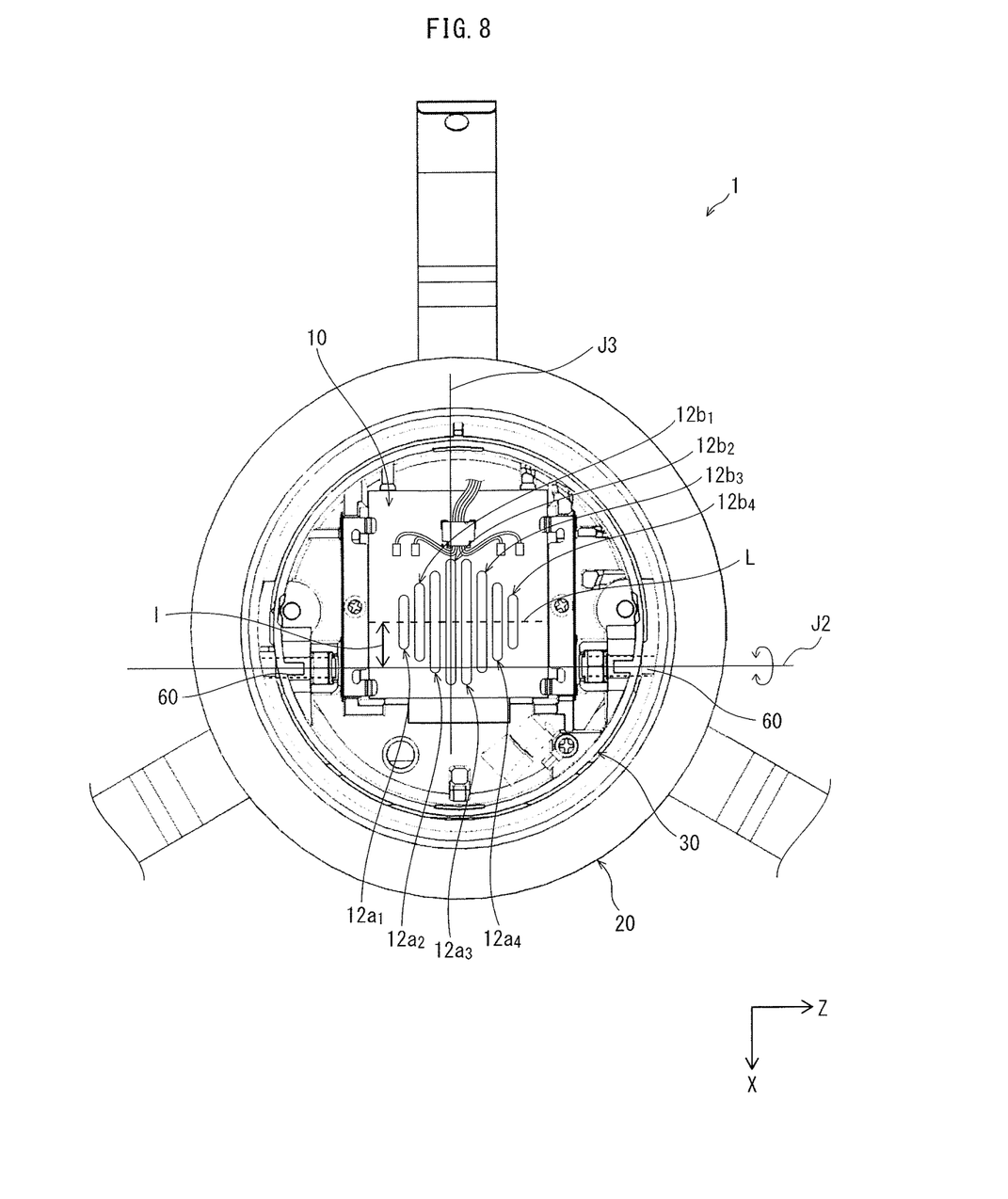
FIG. 8 is a bottom view showing the lighting fixture relating to the embodiment of the present invention.

Next, description is given on the relationship between arrangement of the light emitting parts and the swing axis J2 with reference to FIG. 8. FIG. 8 is a bottom view showing the lighting fixture 1 from which the reflecting mirror 34 and the diffuser 35 are removed to expose the light emitting module 10.

As shown in FIG. 8, a plurality of light emitting parts which output white light having two different color temperatures are alternately arranged in parallel to the swing axis J2. In other words, the first light emitting parts and the second light emitting parts are alternatively arranged in parallel to the swing axis J2. Specifically, the first light emitting part $12a_1$, the second light emitting part $12b_1$, the first light emitting part $12a_2$, the second light emitting part $12b_2$, the first light emitting part $12a_3$, the second light emitting part $12b_3$, the first light emitting part $12a_4$, and the second light emitting part $12b_4$ are arranged in parallel to the swing axis J2 in the stated order. Also, the first light emitting parts $12a_1$ to $12a_4$ and the second light emitting parts $12b_1$ to $12b_4$ are arranged each so as to have a longitudinal direction J3 which is substantially perpendicular to the swing axis J2.

Furthermore, the light emitting parts are arranged eccentrically to the swing axis J2 as shown in FIG. 8. In other words, the light emitting parts are arranged, such that a virtual line L connecting the respective centers of the light emitting parts in the longitudinal direction J3 is parallel to the swing axis J2 and is offset from the swing axis J2 by a distance 1. With this structure, the lighting fixture 1 is used while the housing 30 swings such that the virtual line L is lower than the swing axis J2 in the vertical direction. This reduces an amount of light shielded by the frame 20. Therefore, the lighting fixture 1 can illuminate a large range of a wall at a high luminance.

<Electrical Connection>

Returning to FIG. 7, description is given on electrical connection of the light emitting elements 13 of the light emitting module 10.

The terminals 15a, 15b, 16a, and 16b are formed on the upper surface 11a of the substrate 11 with a conductor pattern. The terminals 15a and 16a supply an electrical power to the light emitting elements 13 included in the first light emitting parts $12a_1$ to $12a_4$. The terminals 15b and 16b supply an electrical power to the light emitting elements 13 included in the second light emitting parts $12b_1$ to $12b_4$. The terminals 15a and 15b are electrode terminals, and the terminals 16a and 16b are ground terminals.

Also, wirings 17 and 18 are formed on the upper surface 11a of the substrate 11 with a conductor pattern. Each two adjacent of the light emitting elements 13 included in the first light emitting parts $12a_1$ to $12a_4$ are electrically connected with each other via the wiring 17. Each two adjacent of the light emitting elements 13 included in the second light emitting parts $12b_1$ to $12b_4$ are electrically connected with each other via the wiring 18.

As described above, since the light emitting surface 12 of the light emitting module 10 is substantially circular, the first light emitting parts $12a_1$ to $12a_4$ differ from each other in terms of the number of the light emitting elements 13 included therein. Similarly, the second light emitting parts $12b_1$ to $12b_4$ differ from each other in terms of the number of the light emitting elements 13 included therein.

In view of this, in the present embodiment as shown in FIG. 7, the light emitting elements 13 included in the first light emitting part $12a_1$ are series-connected with the light emitting elements 13 included in the first light emitting part $12a_3$ via the wiring 17. Also, the light emitting elements 13 included in the first light emitting part $12a_2$ are series-connected with the light emitting elements 13 included in the first light emitting part $12a_4$ via the wiring 17. This results in generation of two groups each including 36 light emitting elements 13 which are series-connected. These two groups are parallel-connected thereby to equalize a supply amount of electric power to the light emitting elements 13.

Similarly, the light emitting elements 13 included in the second light emitting part $12b_1$ are series-connected with the light emitting elements 13 included in the second light emitting part $12b_3$ via the wiring 18. Also, the light emitting elements 13 included in the second light emitting part $12b_1$ are series-connected with the light emitting elements 13 included in the second light emitting part $12b_4$ via the wiring 18. This results in generation of two groups each including 28 light emitting elements 13 which are series-connected. These two groups are parallel-connected thereby to equalize a supply amount of electric power to the light emitting elements 13.

The first light emitting parts are larger than the second light emitting parts in terms of the number of light emitting elements 13 to be included. This is because the first light emitting parts, which have a low color temperature, are lower than the second light emitting parts, which have a high color temperature, in terms of light emitting efficiency (lm/W).

The terminals 15a, 15b, 16a, and 16b are connected with a lighting circuit 4c of a circuit unit 4 which is provided outside of the housing 30 via respective lead wirings 71.

With the electrical connection described above, the lighting fixture 1 can supply an electrical current to each of the first light emitting parts $12a_1$ to $12a_4$ and the second light emitting parts $12b_1$ to $12b_4$ via separate systems.

<Circuit Structure>

As shown in FIG. 7, the circuit unit 4 is a unitized lighting circuit which includes the lighting circuit 4c, an instruction detection circuit 4d and a control circuit 4e.

The circuit unit 4 is electrically connected with an external commercial AC source which is not illustrated. The circuit unit 4 supplies an electrical current which is input from the commercial AC source to the light emitting module 10. The circuit unit 4 separately controls lighting of the first light emitting parts $12a_1$ to $12a_4$ and the second light emitting parts $12b_1$ to $12b_4$.

The circuit unit 4 is connected with a dimming-toning unit 5. The dimming-toning unit 5 for example includes buttons, tabs, and the like. The dimming-toning unit 5 is used by a user to adjust the luminance and the color temperature of illumination light of the lighting fixture 1. The user operates the buttons, the tabs, and the like of the dimming-toning unit 5 so as to designate desired brightness (luminance) and hue (color temperature) of illumination light. Upon receiving the user's operation, the dimming-toning unit 5 outputs a dimming-toning signal corresponding to the user's operation to the circuit unit 4. The structure of the dimming-toning unit 5 is not limited to this. Alternatively, the dimming-toning unit 5 may generate a dimming-toning signal by a computer program which is incorporated therein in advance, and output the generated dimming-toning signal to the circuit unit 4.

The lighting circuit unit 4c is a circuit including an AC/DC converter which is not illustrated, and separately supplies an electric power to the first light emitting parts $12a_1$ to $12a_4$ and the second light emitting parts $12b_1$ to $12b_4$. Specifically, in accordance with an instruction issued from the control circuit 4e, the lighting circuit unit 4c controls the AC/DC converter to convert an AC voltage supplied from the commercial AC source to two types of DC voltages which are each appropriate to the first light emitting parts $12a_1$ to $12a_4$ and the second light emitting parts $12b_1$ to $12b_4$, and to apply the appropriate DC voltage to each of the light emitting elements 13 included in the first light emitting parts $12a_1$ to $12a_4$ and the second light emitting parts $12b_1$ to $12b_4$ as a forward voltage. Note that the AC/DC converter is for example a diode bridge converter.

The instruction detection circuit 4d acquires the dimming-toning signal output from the dimming-toning unit 5. The dimming-toning signal includes information indicating a dimming ratio and a color temperature which correspond to the user's operation. The dimming ratio indicates a brightness relative to a brightness of illumination light at full lighting (at lighting with light output at 100%). The color temperature is represented by a numerical value of 2200 K to 6700 K.

Upon receiving the dimming-toning signal from the dimming-toning unit 5, the instruction detection circuit 4d extracts the information indicating the dimming ratio and the color temperature from the dimming-toning signal, and outputs the extracted information to the control circuit 4e.

The control circuit 4e includes a microprocessor and a memory. The control circuit 4e controls light emission of the first light emitting parts $12a_1$ to $12a_4$ and the second light emitting parts $12b_1$ to $12b_4$ by the microprocessor in order to realize the dimming ratio and the color temperature input from the instruction detection circuit 4d.

The memory for example stores therein a lookup table in which an amount of current to be supplied to each of the first light emitting parts $12a_1$ to $12a_4$ and the second light emitting parts $12b_1$ to $12b_4$ for desired dimming ratio and color temperature. The microprocessor determines the amount of current to be supplied to each of the first light emitting parts $12a_1$ to $12a_4$ and the second light emitting parts $12b_1$ to $12b_4$, with use of the lookup table. The control circuit 4e sets a duty ratio for each of the first light emitting parts $12a_1$ to $12a_4$ and the second light emitting parts $12b_1$ to $12b_4$ to perform PWM (Pulse Width Modulation) control on each of the light emitting parts, such that the determined amount of current is supplied to each of the light emitting parts.

Light emitted from the first light emitting parts $12a_1$ to $12a_4$ and the second light emitting parts $12b_1$ to $12b_4$ are toned as described above. As a result, the lighting fixture 1 can output illumination light having a user's desired color temperature which ranges from candle light having a color temperature of approximately 2200 K to day light having a color temperature of approximately 6700 K.

<Effects of Embodiment>

Figure 9:
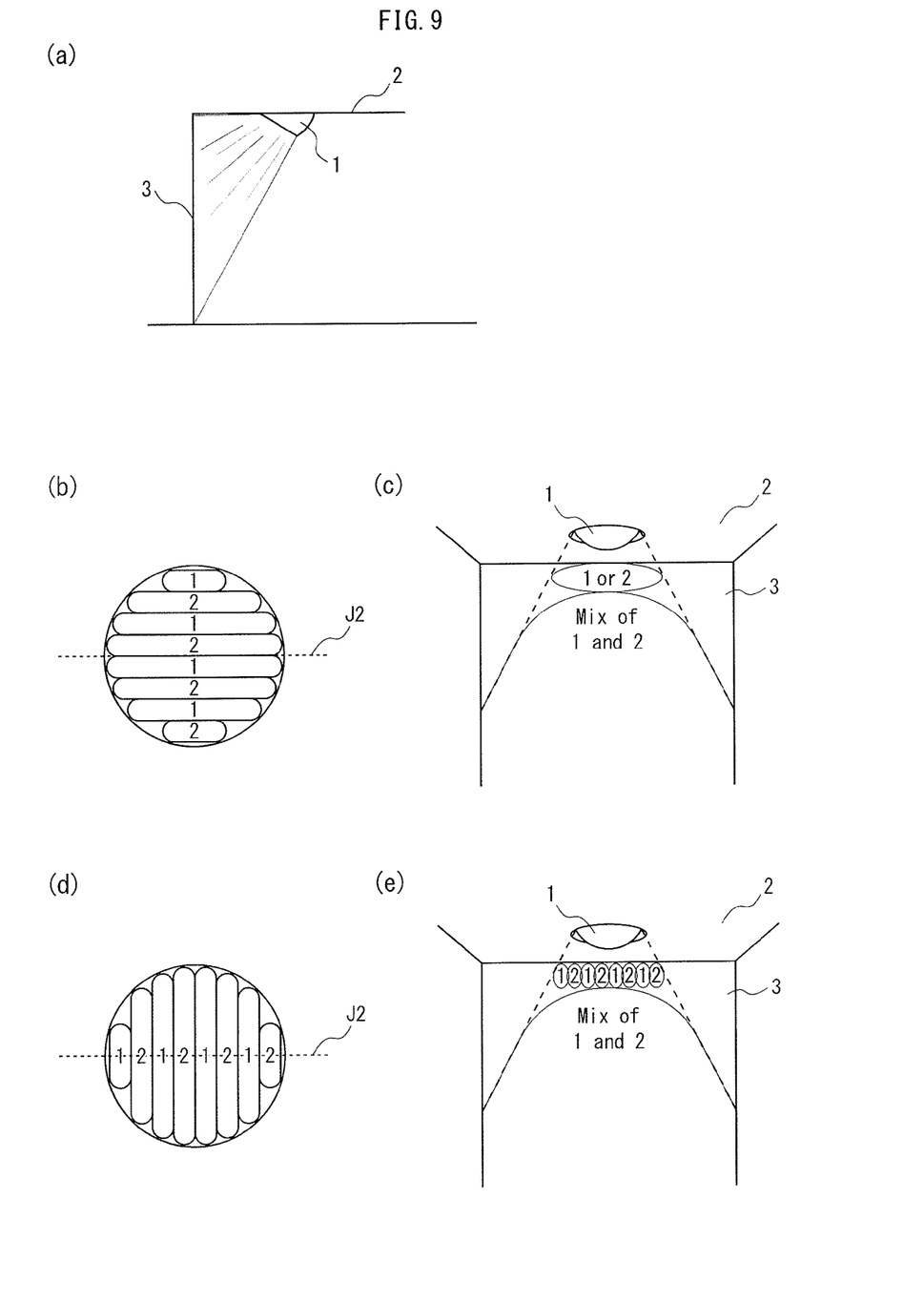
FIG. 9 describes effects of the lighting fixture relating to the embodiment of the present invention.

Next, description is given on the effects of the lighting fixture 1 relating to the present embodiment with reference to FIG. 9.

As shown in section (a) of FIG. 9, the lighting fixture 1 is placed on the ceiling 2. The lighting fixture 1 swings a certain degree about the swing axis, and illuminates the wall 3 in a fixed state. Here, the distance between the lighting fixture 1 and a range of the wall 3 which is an illuminated surface decreases as the range is closer to the ceiling 2, and increases as the range is farther from the ceiling 2. As a result, light emitted from the light emitting elements 13 toward a range of the wall 3 which is near the ceiling 2 is difficult to be diffused. As the distance from the ceiling 2 increases, the emitted light is easier to be diffused.

Under assumption of this situation, the following considers appearance of illumination light in respective cases where light emitting parts are formed as shown in sections (b) and (d) of FIG. 9.

Section (b) of FIG. 9 shows that light emitting parts of two colors are alternately arranged in a direction perpendicular to the swing axis J2. Section (c) of FIG. 9 is a pattern diagram describing appearance of illumination light in the case shown in section (b) of FIG. 9. While a range of the wall 3 where light of two colors is not sufficiently diffused (range of the wall 3 which is near the ceiling 2) is illuminated with only light emitted from the light emitting parts of one of the two colors, other remaining range of the wall 3 is illuminated with light which is a mixture of light emitted from the light emitting parts of the two colors.

Compared with this, section (d) of FIG. 9 shows light emitting parts of two colors are alternately arranged in parallel to the swing axis J2, which correspond to the light emitting module 10 of the present embodiment. Section (e) of FIG. 9 is a pattern diagram describing appearance of illumination light in the case shown in section (d) of FIG. 9. While a range of the wall 3 where light of two colors is not sufficiently diffused (range of the wall 3 which is near the ceiling 2) is illuminated with light emitted from the light emitting parts of the two colors alternately at short intervals of distance, other remaining range of the wall 3 is illuminated with light which is a mixture of light emitted from the light emitting parts of the two colors.

It is easy for a user who is located in an illumination space shown in section (c) of FIG. 9 to notice that the boundary between white light of a single color which has not undergone color mixing and white light which has undergone color mixing appears in the range of the wall 3 which is near the ceiling 2. The boundary appears as if it were a single horizontal line. This gives the user a great uncomfortable feeling.

Compared with this, it is difficult for a user who is located in an illumination space shown in section (e) of FIG. 9 to notice that the boundary between white light of two colors which has not undergone color mixing and white light which has undergone color mixing appears in the range of the wall 3 which is near the ceiling 2. This is because the range of the wall 3 which is near the ceiling 2 is illuminated with the white light of the two colors. This gives the user an uncomfortable feeling which is greatly smaller than the illumination space shown in section (c) of FIG. 9.

For this reason, the first light emitting parts $12a_1$ to $12a_4$ and the second light emitting parts $12b_1$ to $12b_4$ should be alternately arranged in parallel to the swing axis J2 as described in the present embodiment. This reduces an uncomfortable feeling a user has in an illumination space where a range of a wall which is near a ceiling is illuminated.

<Other Modifications>

Although the embodiment of the lighting fixture relating to the present invention has been described, the exemplified lighting fixture may be modified as follows. The present invention is not of course limited to the lighting fixture described in the above embodiment.

(1) In the above embodiment, the first light emitting parts $12a_1$ to $12a_4$ and the second light emitting parts $12b_1$ to $12b_4$ each have a longitudinal direction J3 which is substantially perpendicular to the swing axis J2. In the present invention, however, the longitudinal direction of the light emitting parts does not necessarily need to be substantially perpendicular to the swing axis J2. The longitudinal direction of the light emitting parts should be desirably perpendicular to the swing axis J2 at an angle greater than 45 degrees.

(2) All the light emitting elements each do not necessarily need to have a longitudinal direction J3 which is substantially perpendicular to the swing axis J2. Alternatively, the light emitting surface 12 may have entirely a fan shape, such that only one or more light emitting parts located near the center on the light emitting surface 12 each have a longitudinal direction which is substantially perpendicular to the swing axis J2, and the longer the distance between each of other remaining light emitting parts and the center on the light emitting surface 12 is, the more inclined each of the other remaining light emitting part becomes. In other words, the light emitting surface may have a fan shape so as to have a large region across the swing axis J2 where more light emitting parts are located and a small region across the swing axis J2 where less light emitting parts are located. With this structure, when the lighting fixture in a swing state illuminate a wall, it is possible to illuminate a wide range of the wall at a high luminance.

(3) All the light emitting elements each do not necessarily need to have a longitudinal direction J3 which is substantially perpendicular to the swing axis J2. One or more light emitting parts each may have a longitudinal direction which is parallel to the swing axis J2 as long as light emitting parts whose longitudinal direction is substantially perpendicular to the swing axis J2 account for 50% or more of the entire light emitting surface in terms of area. Accordingly, the present invention includes the case where light emitting parts of different colors are arranged in a circular pattern and the case where light emitting parts of different colors are arranged in a staggered pattern.

(4) In the above embodiment, the element array and the phosphor layer constituting each of the light emitting elements each have a longitudinal direction which is substantially perpendicular to the swing axis J2. However, this structure is not essential to the present invention. As described above, the light emitting part has the shape depending on the shape of the phosphor layer. Accordingly, at least the phosphor layer only needs to have a longitudinal direction which is substantially perpendicular to the swing axis J2, and the element array included in each of the light emitting parts does not need to be linear. Alternatively, the element array included in the light emitting part may have a zigzag shape. Further alternatively, the number of element arrays to be included in each of the light emitting parts may be two.

(5) In the above embodiment, the first light emitting parts and the second light emitting parts, which emit white light of two different colors, are alternately arranged on the substrate. However, the lighting fixture relating to the present invention is not limited to this structure. Alternatively, two first light emitting parts and one second light emitting part are repeatedly arranged in this order on the substrate, for example. The number of the first light emitting parts and the number of the second light emitting parts which are to be repeatedly arranged may be of course reversible.

Figure 10:
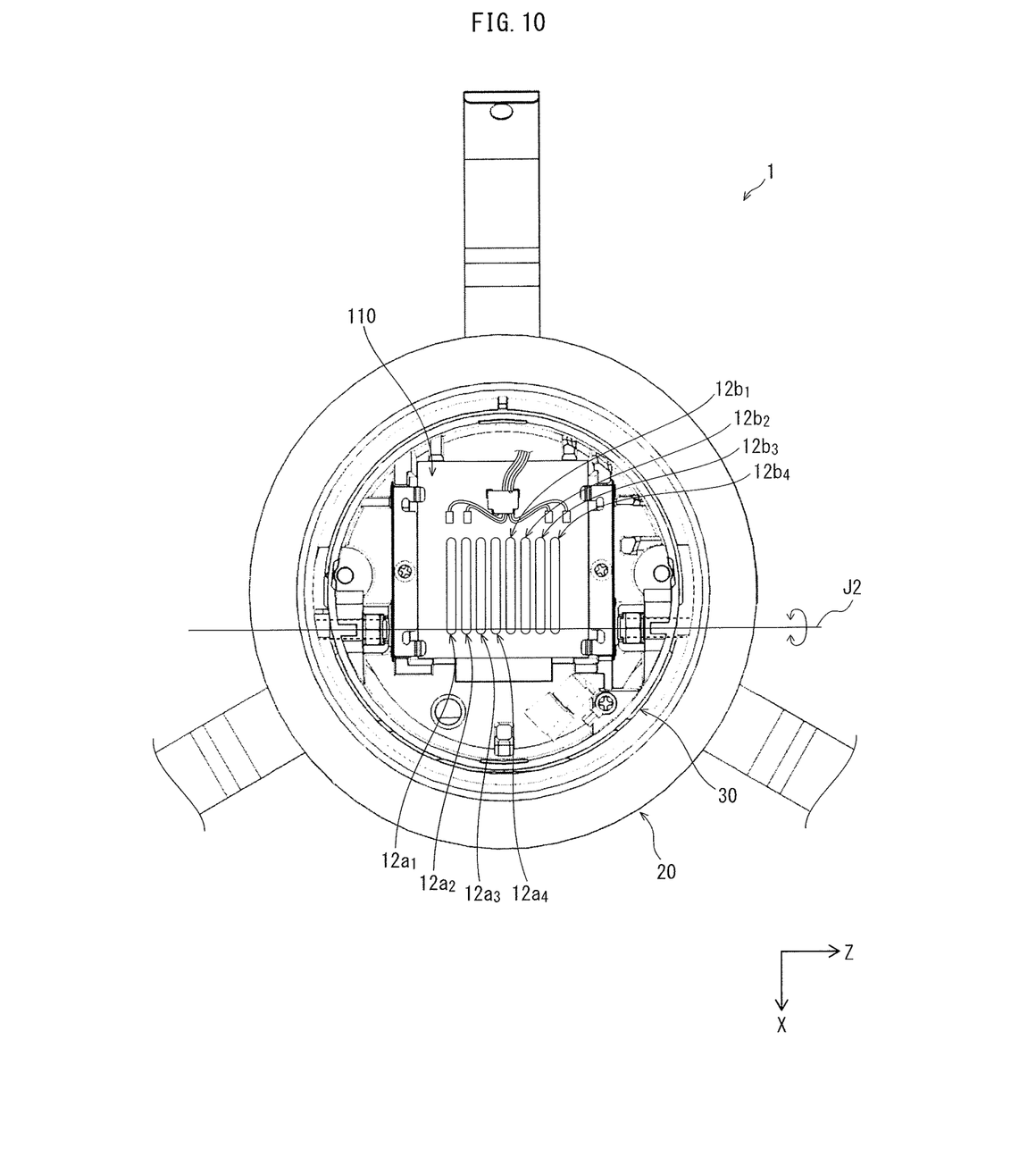
FIG. 10 is a bottom view showing a lighting fixture relating to a modification of the embodiment of the present invention.

(6) It is not essential to the present invention that the first light emitting parts and the second light emitting parts are alternately arranged on the substrate. Alternatively, a light emitting module 110 shown in FIG. 10 may be employed in which the first light emitting parts $12a_1$ to $12a_4$ are arranged in the left half of the substrate, and the second light emitting parts $12b_1$ to $12b_4$ are arranged in the right half of the substrate. Also, the light emitting module 10 of the above embodiment has the light emitting surface 12 which is circular. Compared with this, the light emitting module 110 shown in FIG. 10 has a light emitting surface which is rectangular. The present invention includes the structure of the light emitting module having a rectangular light emitting surface.

(7) It is not essential to the present invention that the first light emitting parts and the second light emitting parts are each elongated. Alternatively, the first light emitting parts and the second light emitting parts each may be for example an SMD (Surface Mount Device).

Specifically, two types of SMDs which emit white light having different color temperatures may be arranged in matrix. In this case, arrays of SMDs which emit white light having a low color temperature and arrays of SMDs which emit white light having a high color temperature may be alternately arranged in parallel to the swing axis.

(8) It is not essential to the present invention that the number of the first light emitting parts and the second light emitting parts which are to be provided are each plural. The present invention includes the structure in which two different types of SMDs are arranged in the direction of the swing axis, as shown in FIG. 11.

Figure 11:
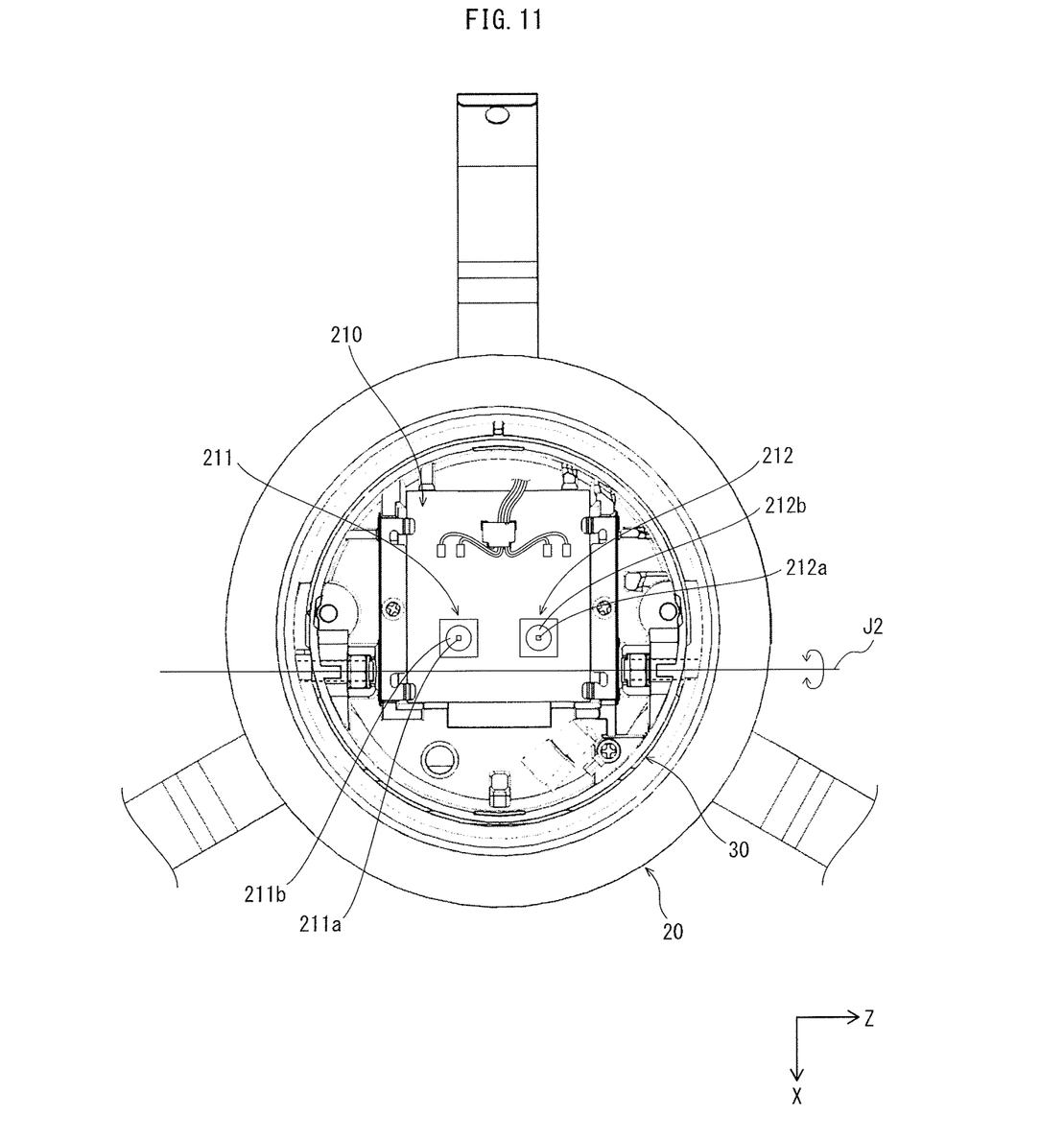
FIG. 11 is a bottom view showing a lighting fixture relating to another modification of the embodiment of the present invention.

A light emitting module 210 shown in FIG. 11 has the structure in which SMDs 211 and 212 are arranged in parallel to the swing axis J2. The SMD 211 is composed of an LED 211a and a sealing member 211b, and the SMD 212 is composed of an LED 212a and a sealing member 212b. The SMDs 211 and 212 each emit white light having a different color temperature.

(9) The light emitting elements relating to the present invention are not limited to blue LEDs which emit blue light having a peak wavelength of 430 nm to 470 nm. Alternatively, the light emitting elements relating to the present invention may be blue LEDs which emit blue light having other peak wavelength, or LEDs which emit light having a peak wavelength of 420 nm or less which ranges from ultraviolet light to blue-violet light. Also, a phosphor as a wavelength conversion material may be a blue phosphor, a green phosphor, a red phosphor, or a mixture of the blue, green, and red phosphors.

(10) In the above embodiment, the first light emitting parts and the second light emitting parts each generate white light through a combination of blue LEDs and a phosphor layer functioning as a wavelength conversion member. However, the first light emitting parts and the second light emitting parts relating to the present invention each do not necessarily need to be composed of light emitting elements and a phosphor layer. Alternatively, the first light emitting part may be composed of blue LEDs and a phosphor layer, and the second light emitting part may be composed of red light emitting elements and a translucent material which does not include a phosphor, for example.

(11) In the above embodiment, toning is performed through a combination of the light emitting parts, which emit white light having a low color temperature, and the light emitting parts, which emit white light having a high color temperature. With this structure, the lighting fixture 1 outputs white light which ranges from candle light to day light having a different hue. However, it is not essential to the present invention that white light having different color temperatures is toned.

Furthermore, the lighting fixture relating to the present invention may include three or more light emitting parts each which emit light of a different color.

The present invention includes the case where a lighting fixture which outputs white light by mixing light of three colors which is emitted from a red light emitting element (R) as a first light emitting part, a green light emitting element (G) as a second light emitting part, and a blue light emitting element (B) as a third light emitting part.

(12) In the above embodiment, the first light emitting parts $12a_1$ to $12a_4$ and the second light emitting parts $12b_1$ to $12b_4$ are modularized on the same substrate. However, the lighting fixture relating to the present invention is not limited to this structure. It is not necessary to the present invention that the first light emitting parts $12a_1$ to $12a_4$ and the second light emitting parts $12b_1$ to $12b_4$ are all arranged on the same substrate, as long as the first light emitting parts $12a_1$ to $12a_4$ and the second light emitting parts $12b_1$ to $12b_4$ are attached to the housing 30.

(13) In the above embodiment, the description has been given on the light emitting elements relating to the present invention with use of LEDs. Alternatively, the light emitting elements relating to the present invention may be LDs (laser diodes), EL (electroluminescence) elements, or the like.

(14) The above embodiment and the above modifications may be appropriately combined.

<Supplement>

The following further describes the structure of a lighting fixture as one aspect of the present invention, and modifications and effects thereof.

(a) A lighting fixture comprises: a frame; a housing that is supported so as to be swingable relative to the frame about a swing axis; a first light emitting part that is provided in the housing and emits light of a first color; and a second light emitting part that is provided in the housing and emits light of a second color differing from the first color, wherein the first light emitting part and the second light emitting part are arranged in parallel to the swing axis.

With this structure, when the first light emitting part and the second light emitting part illuminate a wall while the housing swings relative to the frame, a range of the wall where light of two colors is not sufficiently diffused (range of the wall which is near a ceiling) is illuminated with light emitted from the first light emitting part and light emitted from the second light emitting part. Also, other remaining range of the wall is illuminated with light which has undergone mixing of the light of the two colors. Therefore, it is difficult to notice color unevenness which occurs at the boundary between the range where the light of the two colors is not sufficiently diffused and the other remaining range.

Note that the first light emitting part and the second light emitting part are provided in the housing so as to illuminate in the same direction.

(b) Here, the first light emitting part and the second light emitting part are each elongated, and each have a longitudinal direction that is perpendicular to the swing axis.

With this structure, when the first light emitting part and the second light emitting part illuminate the wall while the housing swings relative to the frame, an amount of light shielded by the frame is reduced. Therefore, the lighting fixture can illuminate a large range of the wall at a high luminance.

(c) Here, the first light emitting part and the second light emitting part are formed on the same substrate, and the first light emitting part and the second light emitting part are modularized and attached to the housing.

With this structure, the first light emitting part and the second housing part, which are formed on the same substrate, illuminate in the same direction. Also, it is possible to manufacture various types of lighting fixtures which vary in terms of shape, size, dimming range, and so on by attaching various types of modules to the housing.

(d) Here, the first light emitting part and the second light emitting part are each provided in plural, and the first light emitting parts and the second light emitting parts are alternately arranged on the substrate.

With this structure, light emitted from the first light emitting parts and light emitted from the second housing parts easily undergo color mixing. This reduces color unevenness of illumination light. Also, when the first light emitting parts and the second light emitting parts illuminate the wall while the housing swings relative to the frame, the range of the wall where light of two colors which are emitted from the first light emitting parts and the second light emitting parts is not sufficiently diffused is illuminated with the light emitted from the light emitting parts of the two colors alternately at short intervals of distance. Therefore, it is difficult to notice the boundary between the light of the two colors which has not undergone color mixing and light which has undergone color mixing.

(e) Here, the first light emitting parts each include a plurality of light emitting elements that are linearly arranged on the substrate and a first sealing member that collectively seals the light emitting elements, and the second light emitting parts each include a plurality of light emitting elements that are linearly arranged on the substrate and a second sealing member that collectively seals the light emitting elements.

Here, the expression "a plurality of light emitting elements are linearly arranged" is not limited to the case where a plurality of light emitting elements are arranged in a single line, and includes the case where two arrays each including a plurality of light emitting elements are arranged and the case where a plurality of light emitting elements are arranged in a zigzag pattern.

With this structure, the light emitting elements, which are included in each of the first light emitting parts and the second housing parts, are separately sealed for each array. This provides a space between each two adjacent of the sealing members, thereby to improve the heat sink effect.

(f) Here, the light of the first color and the light of the second color are each white light having a different color temperature, the lighting fixture is connected with a toning unit that designates a color temperature of illumination light, and the lighting fixture further comprises a circuit unit that supplies a driving current separately to the first light emitting part and the second light emitting part such that illumination light having the color temperature designated by the toning unit is output.

With this structure, it is possible to provide a universal downlight which is capable of toning. When a wall is illuminated by this universal downlight, color unevenness which appears on the wall is difficult to notice. Therefore, the universal downlight is utilizable as an effective stage lighting fixture.

REFERENCE SIGNS LIST 1 lighting fixture
10, 110, and 210 light emitting module
$12a_1$ to $12a_4$ first light emitting part
$12b_1$ to $12b_4$ second light emitting part
13 light emitting element
14a first phosphor layer
14b second phosphor layer
20 frame
30 housing
40 bearing
50 hold-down member
60 bolt (swing axis)

The invention claimed is:

1. A lighting fixture comprising:
a frame;
a housing that is supported so as to be swingable relative to the frame about a swing axis;
an elongated first light emitting part that is provided in the housing and emits light of a first color; and
an elongated second light emitting part that is provided in the housing and emits light of a second color differing from the first color, wherein
the first light emitting part and the second light emitting part are arranged in parallel to the swing axis, and
a virtual line is parallel to the swing axis and is distant from the swing axis, the virtual line connecting respective centers of the first light emitting part and the second light emitting part in respective longitudinal directions of the first light emitting part and the second light emitting part.

2. The lighting fixture of claim 1, wherein
the respective longitudinal directions of the first light emitting part and the second light emitting part are perpendicular to the swing axis.

3. The lighting fixture of claim 2, wherein
the first light emitting part and the second light emitting part are formed on the same substrate, and
the first light emitting part and the second light emitting part are modularized and attached to the housing.

4. The lighting fixture of claim 3, wherein
the first light emitting part and the second light emitting part are each provided in plural, and
the first light emitting parts and the second light emitting parts are alternately arranged on the substrate.

5. The lighting fixture of claim 4, wherein
the first light emitting parts each include a plurality of light emitting elements that are linearly arranged on the substrate and a first sealing member that collectively seals the light emitting elements, and
the second light emitting parts each include a plurality of light emitting elements that are linearly arranged on the substrate and a second sealing member that collectively seals the light emitting elements.

6. The lighting fixture of claim 2, wherein
the light of the first color and the light of the second color are each white light having a different color temperature,
the lighting fixture is connected with a toning unit that designates a color temperature of illumination light, and
the lighting fixture further comprises a circuit unit that supplies a driving current separately to the first light emitting part and the second light emitting part such that illumination light having the color temperature designated by the toning unit is output.

* * * * *